(12) United States Patent
Akizawa et al.

(10) Patent No.: US 8,416,004 B2
(45) Date of Patent: Apr. 9, 2013

(54) CIRCUIT MODULE FOR LIMITING OCCURRENCE OF INRUSH CURRENT

(75) Inventors: Masaru Akizawa, Kawasaki (JP); Kazuyoshi Shimizu, Kawasaki (JP)

(73) Assignee: Fujitsu Optical Components Limited, Kawasaki (JP)

( * ) Notice: Subject to any disclaimer, the term of this patent is extended or adjusted under 35 U.S.C. 154(b) by 0 days.

(21) Appl. No.: 13/314,642

(22) Filed: Dec. 8, 2011

(65) Prior Publication Data

US 2012/0074992 A1   Mar. 29, 2012

Related U.S. Application Data

(63) Continuation of application No. PCT/JP2009/061045, filed on Jun. 17, 2009.

(51) Int. Cl.
*H03K 5/08* (2006.01)
(52) U.S. Cl. ....... 327/310; 327/546; 323/908; 361/93.9; 710/302
(58) Field of Classification Search .......... 327/310, 327/546; 323/908; 361/93.9; 710/302
See application file for complete search history.

(56) References Cited

U.S. PATENT DOCUMENTS

| | | | | |
|---|---|---|---|---|
| 5,432,916 A | * | 7/1995 | Hahn et al. | 710/302 |
| 5,559,660 A | * | 9/1996 | Watson et al. | 361/58 |
| 5,764,926 A | * | 6/1998 | Fukuda et al. | 710/302 |
| 5,886,431 A | * | 3/1999 | Rutigliano | 307/131 |
| 5,951,660 A | * | 9/1999 | Van Wonterghem | 710/302 |
| 2004/0008079 A1 | | 1/2004 | Osamura et al. | |
| 2007/0145922 A1 | | 6/2007 | Ito et al. | |
| 2009/0039846 A1 | | 2/2009 | Ito et al. | |

FOREIGN PATENT DOCUMENTS

| | | |
|---|---|---|
| JP | 7-302142 | 11/1995 |
| JP | 2003-330555 | 11/2003 |
| JP | 2004-46616 | 2/2004 |
| JP | 2007-179345 | 7/2007 |

OTHER PUBLICATIONS

International Search Report for PCT/JP2009/061045 mailed Jul. 28, 2009.
"Hot Swap Controller in 6-Lead SOT-23 Package", LTC4210-1/LTC4210-2, Linear Technology Corporation, 2002, 20pages.
"XENPAK 10 Gigabit Ethernet MSA, A Cooperation Agreement for 10 Gigabit Ethernet Transceiver Package, Issue 3.0", [online], Internet URL:http://www.cotsworks.com/PDFs/XENPAK_MSA R3.0%5B1%5D.pdf), Sep. 18, 2002, 77pages.

* cited by examiner

*Primary Examiner* — Kenneth B. Wells
(74) *Attorney, Agent, or Firm* — Staas & Halsey LLP

(57) ABSTRACT

A circuit module includes: control object circuits which start operations when a power supply voltage reaches a target value; a current sink circuit which consumes a current supplied thereto; and a power supply activation control unit which increases the current flowing into the current sink circuit at a predetermined rate before starting the operations of the control object circuits and which starts the operations of the control object circuits and simultaneously blocks the supply of the current to the current sink circuit in a case where an amount of the current flowing into the current sink circuit is equivalent to an amount of current to be increased by starting the operations of the control object circuits when the power supply voltage reaches the target value.

4 Claims, 13 Drawing Sheets

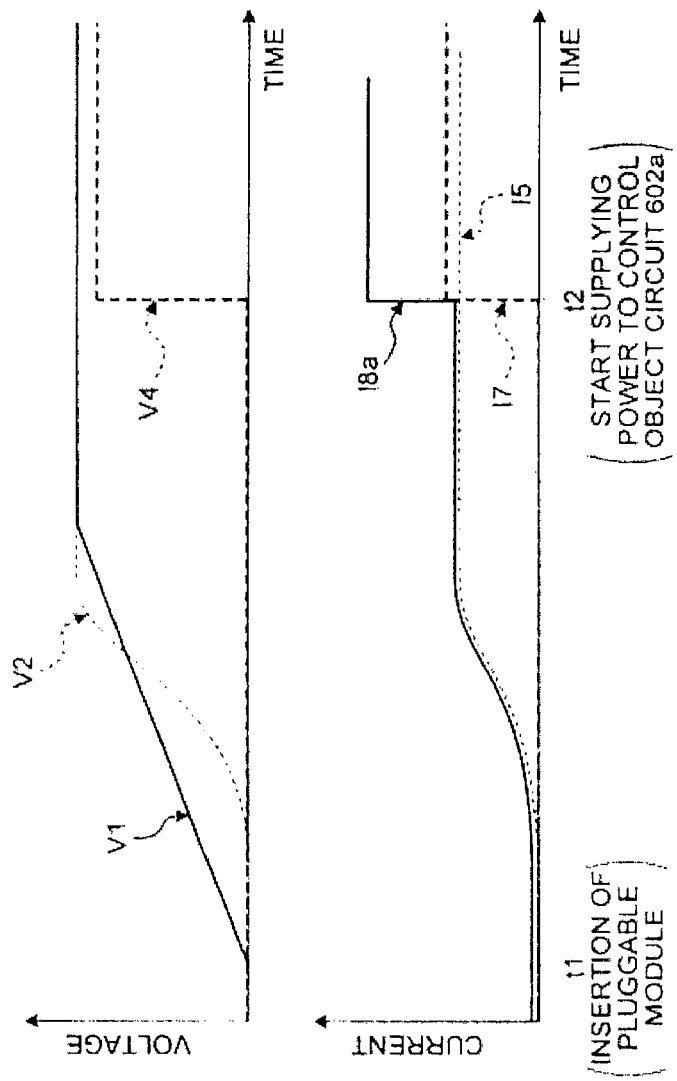

CIRCUIT MODULE FOR LIMITING OCCURRENCE OF INRUSH CURRENT

CROSS-REFERENCE TO RELATED APPLICATION

This application is a continuation of International Application No. PCT/JP2009/61045, filed on Jun. 17, 2009, the entire contents of which are incorporated herein by reference.

FIELD

The embodiments discussed herein are directed to a circuit module, and more particularly, to a circuit module capable of limiting the occurrence of an inrush current.

BACKGROUND

In the related art, as a circuit module, a pluggable module is known which can be inserted into or removed from a main body of an apparatus during the operation of the apparatus. For example, the pluggable module is an electro-optical conversion module which is mounted on a server apparatus, a router, a switch, or the like that are used for optical communication.

In a case where the pluggable module is inserted into the apparatus main body, a large current is likely to instantaneously flow from the apparatus main body into the pluggable module at the time when the pluggable module is activated. In this manner, the large current which instantaneously flows from the apparatus main body into the pluggable module at the time when the pluggable module is inserted into the apparatus main body is referred to as an inrush current.

In some cases, the occurrence of the inrush current may have a negative influence on other pluggable modules which have been already inserted into the apparatus main body. More specifically, when pluggable modules are inserted into the apparatus main body, the pluggable modules use a power supply installed in the apparatus main body as a common power supply. Therefore, for example, when a new pluggable module is further inserted into the apparatus main body, the current flowing from the apparatus main body into that pluggable module instantaneously increases due to the inrush current caused by the activation of the pluggable module. As a result, the power supply voltage of the apparatus main body temporarily decreases, and thus an operation failure may occur on the other pluggable modules which share the power supply.

In this manner, the inrush current caused by the insertion of the pluggable module into the apparatus main body may negatively affect the other pluggable modules. Therefore, in order to prevent the occurrence of this problem, the rate of change in the current flowing into the pluggable module is set according to a standard, in such a manner that the rate of change is always equal to or less than a predetermined value (for example, 50 mA/mSec). This technique has been known as disclosed in, for example, "XENPAK 10 Gigabit Ethernet MSA, A Cooperation Agreement for 10 Gigabit Ethernet Transceiver Package, Issue 3.0", [online], [searched on Mar., 25, 2009], Internet <URL:http://www.cotsworks.com/PDFs/XENPAK_MSA_R3.0%5B1%5D.p df>).

Therefore, in some cases, an inrush current control unit for preventing the occurrence of the inrush current may be installed in the pluggable module. The inrush current control unit is, for example, a hot swap controller (Product No.: LTC4210) manufactured by Linear Technology Corporation, or the like. The inrush current control unit limits the inrush current by gradually decreasing a resistance value of an FET provided on the power supply line from the maximum value thereof.

However, in some cases, the occurrence of the inrush current may not be sufficiently suppressed only by the control of the inrush current control unit of the related art.

For example, when a circuit that has a power-on reset function is provided in the pluggable module, the inrush current may still occur even if the inrush current is controlled by the inrush current control unit of the related art.

The power-on reset function is a process for turning off the electrical state of the circuit during a period between the power-on time and the time when a predetermined reset time passes in order to prevent the occurrence of a problem caused by the operation of the circuit until the time when the power supply voltage reaches a target value. FIG. 13 illustrates the state in which a plurality of pluggable modules is inserted into the apparatus main body in the related art.

As illustrated in FIG. 13, a plurality of pluggable modules 600a to 600n is inserted into an apparatus main body 500 that includes a power supply 510. The pluggable module 600a includes a circuit 601 that does not have the power-on reset function (hereinafter, simply referred to as "circuit"), a control object circuit 602a that has the power-on reset function, and a control object circuit 602b that is a thermoelectric cooler (TEC) circuit that controls a temperature. In addition, the pluggable module 600a includes a laser diode (hereinafter, "LD") 603, a power supply activation control unit 604, a hot swap controller 605, and a field effect transistor (hereinafter, "FET") 606. The power supply activation control unit 604 controls the supplying and blocking of the current to the circuit 601 and the control object circuits 602a and 602b. The hot swap controller 605 corresponds to the inrush current control unit and limits the inrush current by gradually decreasing the resistance value of the FET 606 provided on the power supply line from the maximum value thereof.

The control object circuit 602b includes a temperature control unit 611, a TEC driver 612, and a TEC 613. The temperature control unit 611 is a control unit which controls the temperature of the LD 603. The temperature control unit 611 outputs a control signal for adjusting the temperature of the LD 603 to a set temperature to the TEC driver 612. The TEC driver 612 supplies a current to the TEC 613 on the basis of the control signal output from the temperature control unit 611. The TEC 613 is a thermoelectric conversion device that adjusts the temperature of the LD 603. The TEC 613 converts the power supplied from the TEC driver 612 into heat to adjust the temperature of the LD 603.

FIG. 14 is a graph illustrating a temporal change of the voltage and the current in the pluggable module 600a of the related art. In addition, as illustrated in FIG. 13, the power supply voltage of the apparatus main body 500 is denoted by V0; the control voltage of the resistance value of the FET 606 provided on the power supply line is denoted by V1; the power supply voltage in the pluggable module 600a is denoted by V2; and the voltage for starting the operation of the control object circuit 602a is denoted by V4. Similarly, the current flowing into the circuit 601 is denoted by I5; the current flowing into the control object circuit 602a is denoted by I7; the currents flowing into the pluggable modules 600a to 600n are respectively denoted by I8a to I8n; and the current flowing into the control object circuit 602b is denoted by I12.

As illustrated in FIG. 14, when the pluggable module 600a is inserted into the apparatus main body 500 at t1, the hot swap controller 605 gradually increases the voltage V1 applied to the FET 606 to gradually decrease the resistance value of the FET 606. Accordingly, because the power supply voltage V2 and the current I8a in the pluggable module 600a are gradually increased without a rapid increase, the occurrence of the inrush current is limited at the time of starting the circuit.

On the other hand, the control object circuit 602a that has the power-on reset function is in the state in which the current is blocked by the power supply activation control unit 604 until the power supply voltage V2 in the pluggable module 600a reaches a target voltage (for example, ±5% of a rated value). Next, when the power supply voltage V2 in the pluggable module 600a reaches the target voltage and a predetermined reset period elapses, the power supply activation control unit 604 applies the voltage V4 for starting the operation of the control object circuit 602a to the control object circuit 602a. Accordingly, the current I7 starts to flow into the control object circuit 602a at once in response to the start of the operation.

In other words, as illustrated in FIG. 14, when the voltage V4 is applied to the control object circuit 602a at t2, the current I7 starts to flow into the control object circuit 602a at once, and thus the current I8a flowing into the entirety of the pluggable module 600a also rapidly increases. As a result, in some cases, the power supply voltage VO of the apparatus main body 500 is temporarily decreased, and thus an operation failure may occur on the other pluggable modules 600b to 600n.

In this manner, because a circuit that has the power-on reset function starts the operation at once at the time when a predetermined reset period elapses, the inrush current control unit of the related art may not solve the problem. Therefore the inrush current may occur in the related art. In other words, the inrush current control unit of the related art may not meet the standard that the rate of change rate in the current flowing into a pluggable module is equal to or less than a predetermined value.

SUMMARY

According to an aspect of embodiments, a circuit module includes: a control object circuit that starts an operation when a power supply voltage reaches a target value; a current sink circuit that consumes a current supplied thereto; and a power supply activation controller that increases the current flowing into the current sink circuit at a predetermined rate before starting the operation of the control object circuit and that makes the control object circuit start the operation and simultaneously blocks a supply of the current to the current sink circuit when an amount of the current flowing into the current sink circuit is equivalent to an amount of current to be increased by starting the operation of the control object circuit.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 14 is a graph illustrating temporal changes in a voltage and a current in the pluggable module of the related art.

DESCRIPTION OF EMBODIMENTS

Preferred embodiments of the present invention will be explained with reference to accompanying drawings. Hereinafter, although the description is made on a pluggable module, which may be detachable from an apparatus main body during the operation of the apparatus, as an example of the circuit module, the circuit module according to the present invention is not limited thereto, but it may also be applied to a module which is installed in the apparatus main body.

[a] First Embodiment

Figure 1:
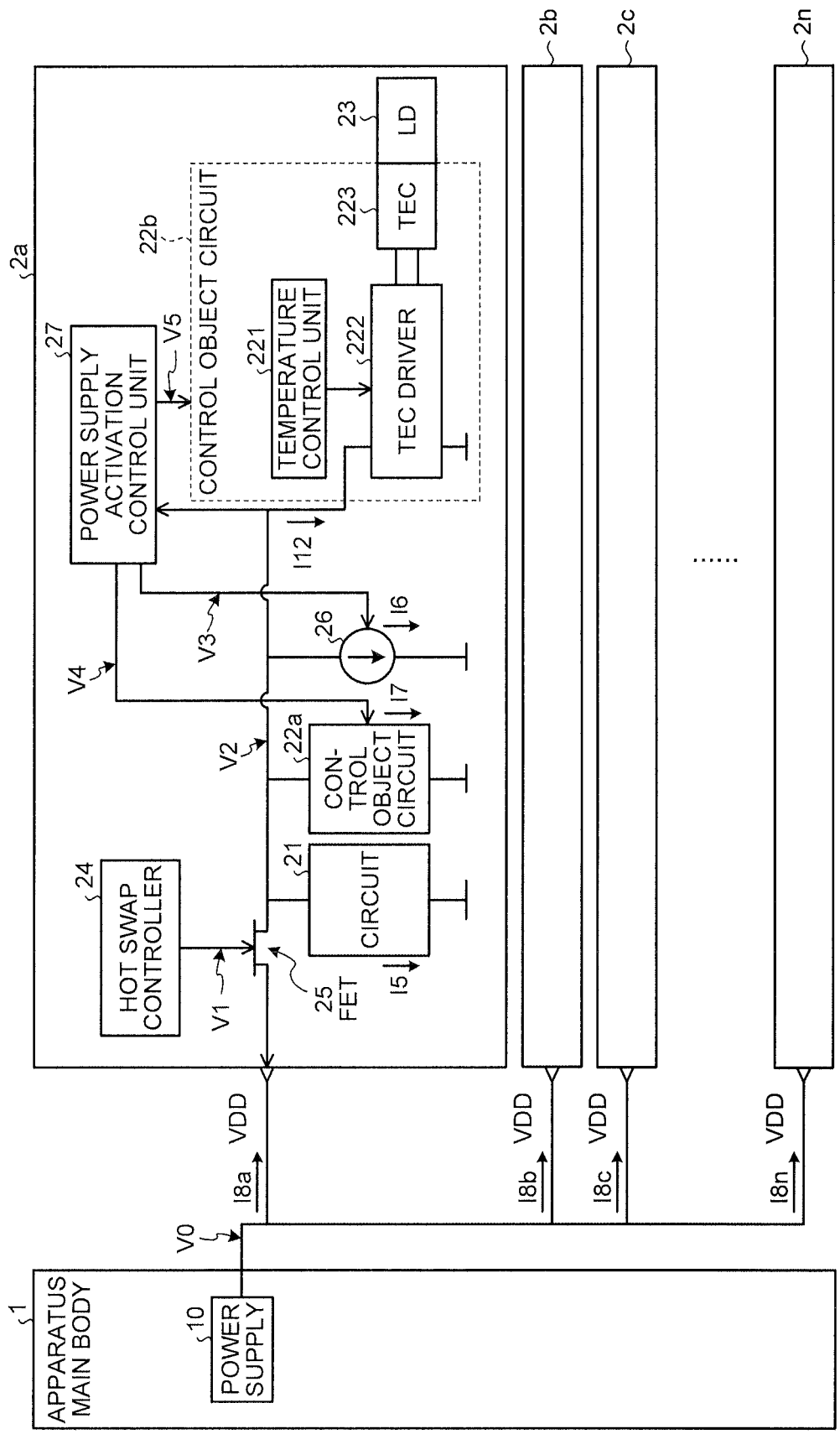
FIG. 1 is a schematic diagram illustrating the configuration of a pluggable module according to a first embodiment.

First, a configuration of a pluggable module according to the embodiment will be described by using the drawings. FIG. 1 is a schematic diagram illustrating a configuration of the pluggable module according to a first embodiment. As illustrated in FIG. 1, a plurality of pluggable modules 2a to 2n are inserted into an apparatus main body 1 which includes a power supply 10. Herein, the apparatus main body 1 is, for example, an optical communication router.

The pluggable module 2a is a circuit module which may be detachable from the apparatus main body 1 during the operation of the apparatus. More specifically, the pluggable module 2a is an electro-optical conversion module which performs an EO/OE conversion between an electrical signal and an optical signal. The pluggable module 2a includes a circuit 21 that does not have the power-on reset function (hereinafter, simply referred to as "circuit"), a control object circuit 22a that has the power-on reset function, and a control object circuit 22b which is a temperature control circuit for performing temperature control. In addition, the pluggable module 2a includes a Laser Diode (LD) 23, a hot swap controller 24, an FET 25, a current sink circuit 26, and a power supply activation control unit 27. The power supply activation control unit may be expressed in a power supply activation controller. In this case, the controller includes a configuration such as a control circuit or a central processing unit.

The control object circuit 22a is, for example, a circuit equipped with a CPU core, such as a system LSI or a Field Programmable Array (FPGA), in which a CPU is installed. The control object circuit 22a is a circuit that has the power-on reset function at the beginning of the operation. Herein, the power-on reset function is a process for preventing the occurrence of a problem caused by the start of the operation of the circuit until a power supply voltage reaches a target value (for example, a value within ±5% from a rated value).

As more specifically described, the power supply voltage does not instantaneously reach the rated value after the power-on but it takes a certain time period to raise the power supply voltage up to the rated value. A circuit, including a CPU core, such as the control object circuit 22a may not operate normally to cause errors if the circuit begins to operate before the power supply voltage rises up. Therefore, the circuit is electrically turned off during a period from the power-on to the time when the power supply voltage reaches the target value by performing the power-on reset function, and thus the associated problem is prevented in advance.

The control object circuit 22b is, for example, a TEC circuit. The control object circuit 22b includes a temperature control unit 221, a TEC driver 222, and a TEC 223. The temperature control unit 221 is a control unit which controls the temperature of the LD 23. The temperature control unit 221 outputs a control signal, used to adjust the temperature of the LD 23 to the setting temperature, to the TEC driver 222. The TEC driver 222 supplies power to the TEC 223 based on the control signal output from the temperature control unit 221. The TEC 223 is a thermoelectric conversion element for adjusting the temperature of the LD 23. The TEC 223 converts the power supplied from the TEC driver 222 into heat and transports the heat to the LD 23. The LD 23 is a temperature control object of the control object circuit 22b. In addition, the control object circuit 22b is a circuit of which the operation is controlled by the control object circuit 22a. The operation of the control object circuit 22b begins after the operation of the control object circuit 22a begins.

The hot swap controller 24 limits the inrush current by gradually decreasing the resistance value of the FET 25 installed in the power supply line from the maximum value thereof. The FET 25 is a field effect transistor and changes the amount of current flowing in the power supply line according to the voltage applied from the hot swap controller 24. The current sink circuit 26 is a circuit which consumes the current supplied thereto. More specifically, the current sink circuit 26 is a current source for sinking and allows the current supplied from the power supply 10 of the apparatus main body 1 to flow into the ground as it is.

The power supply activation control unit 27 performs the control on the timings for starting the operations of the control object circuits 22a and 22b or the control on the current supplied to the current sink circuit 26 so as to limit the inrush current flowing in the power supply line. More specifically, the power supply activation control unit 27 performs the control such that an amount of current, corresponding to an increase in current due to the start of the operation of the control object circuit 22a before the beginning of the operation of the control object circuit 22a, flows into the current sink circuit 26. Subsequently, the power supply activation control unit 27 blocks the current supplied to the current sink circuit 26 simultaneously with the beginning of the operation of the control object circuit 22a.

Figure 2:
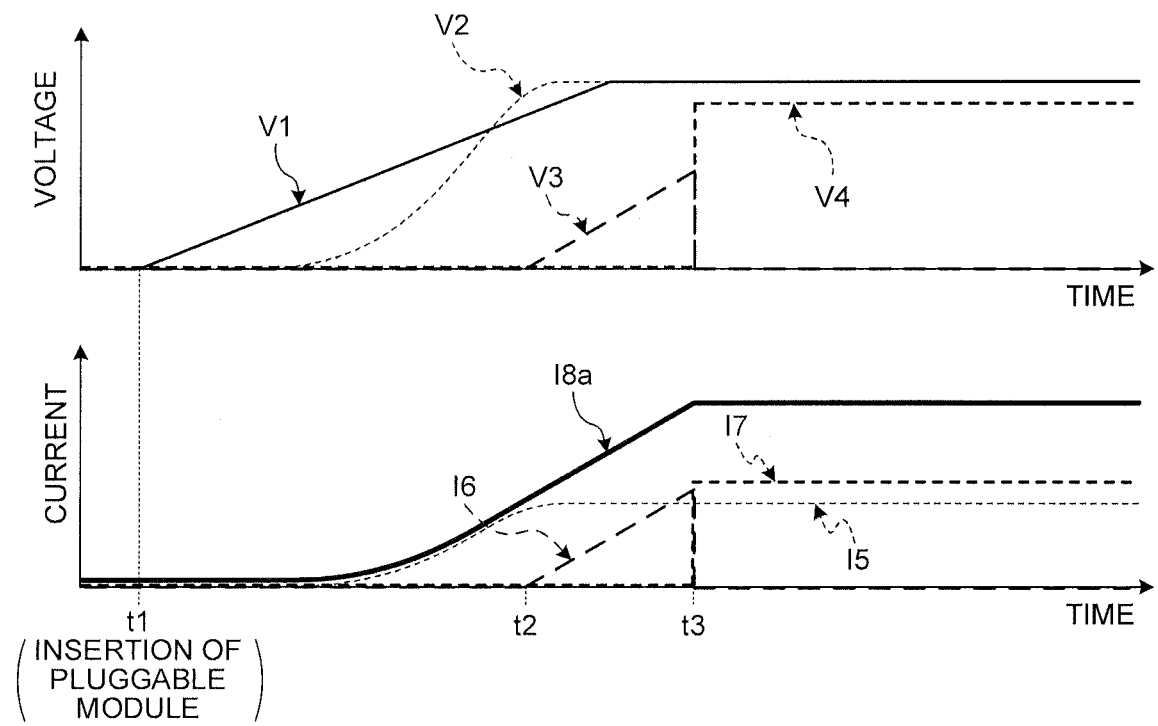
FIG. 2 is a graph illustrating temporal change in a voltage and a current in the pluggable module according to the first embodiment.

Hereinafter, a description will be made in connection with a state in which the inrush current is limited by the control of the power supply activation control unit 27 according to the embodiment. FIG. 2 is a graph illustrating a temporal change in the voltage and the current in the pluggable module 2a according to the first embodiment.

In addition, as illustrated in FIG. 1, the power supply voltage of the apparatus main body 1 is denoted by VU; the control voltage of the resistance value of the FET 25 is denoted by V1; the power supply voltage in the pluggable module 2a is denoted by V2; the control voltage for controlling the current flowing into the current sink circuit 26 is denoted by V3; the voltage for starting the operation of the control object circuit 22a is denoted by V4; and the voltage for starting the operation of the control object circuit 22b is denoted by V5. Similarly, the current flowing into the circuit 21 is denoted by I5; the current flowing into the current sink circuit 26 is denoted by I6; the current flowing into the control object circuit 22a is denoted by I7; the currents flowing into the pluggable modules 2a to 2n are denoted by I8a to I8n, respectively; and the current flowing into the control object circuit 22b is denoted by I12.

As illustrated in FIG. 2, when the pluggable module 2a is inserted into the apparatus main body 1 at t1, the hot swap controller 24 gradually increases the voltage V1 applied to the FET 25 to gradually decrease the resistance value of the FET 25. Accordingly, because the power supply voltage V2 in the pluggable module 2a is gradually increased without a rapid increase thereof, the current I5 gradually flows into the circuit 21, which starts the operation from before the power supply voltage V2 reaches the rated value, in accordance with the increase in the power supply voltage V2. As a result, the current I8a flowing into the pluggable module 2a is also gently increased, and thus the occurrence of the inrush current is limited at the time of starting the circuit.

In this manner, the hot swap controller 24 controls the current flowing into the pluggable module 2a by gradually decreasing the resistance value of the FET 25 from the maximum value thereof, and thus the occurrence of the inrush current can be limited at the time of activating the pluggable module 2a.

Subsequently, in a case where the gradually increasing power supply voltage V2 in the pluggable module 2a reaches a predetermined voltage at t2, the power supply activation control unit 27 starts supplying the current to the current sink circuit 26. More specifically, in a case where it is determined that the power supply voltage V2 reaches a predetermined voltage, the power supply activation control unit 27 applies the control voltage V3 to the current sink circuit 26. Accordingly, the current I6 starts to flow into the current sink circuit 26. In addition, the predetermined voltage is a voltage of, for example, about 94 to 96% of the rated value of the power supply voltage V2.

In this manner, in a case where the power supply voltage V2 reaches the predetermined voltage, the power supply activation control unit 27 starts supplying the current I6 to the current sink circuit 26.

Herein, the power supply activation control unit 27 increases the current I6 flowing into the current sink circuit 26 at a predetermined rate by increasing the control voltage V3 applied to the current sink circuit 26. More specifically, the power supply activation control unit 27 increases the current I6 such that the slope of the current I6, that is, the change rate of the current I6 illustrated in FIG. 2 is less than the change rate of 50 mA/mSec set by the standard. Accordingly, the current I6 flowing into the current sink circuit 26 is gradually increased with the change rate satisfying the standard, and thus the current I8a flowing into the pluggable module 2a is also gradually increased.

On the other hand, the control object circuit 22a that has the power-on reset function is in the state in which the current is blocked by the power supply activation control unit 27 until the power supply voltage V2 in the pluggable module 2a reaches a target value. In other words, the voltage V4 for starting the operation of the control object circuit 22a is maintained at zero until the power supply voltage V2 in the pluggable module 2a reaches the target value.

Next, the power supply voltage V2 reaches the target value, and the current I6 flowing into the current sink circuit 26 becomes equivalent to the amount of the current which is increased in the pluggable module 2a due to the start of the operation of the control object circuit 22a. In this case, the power supply activation control unit 27 blocks the current supplied to the current sink circuit 26 at the same time of staring the operation of the control object circuit 22a. Herein, the amount of the current which is increased in the pluggable module 2a due to the start of the operation of the control object circuit 22a corresponds to, for example, a maximum value of the current at the time of a normal operation of the control object circuit 22a.

In other words, in a case where, after the power supply voltage V2 reaches the target value, the amount of the current to the current sink circuit 26 reaches the maximum value of the current at the time of the normal operation of the control object circuit 22a, the power supply activation control unit 27 stops applying the control voltage V3 to the current sink circuit 26. Accordingly, the current I6 flowing into the current sink circuit 26 is blocked. In addition, the power supply activation control unit 27 blocks the current I6 and simultaneously applies the voltage V4 to the control object circuit 22a to start the operation of the control object circuit 22a.

Accordingly, as illustrated in FIG. 2, if the amount of the current to the current sink circuit 26 reaches the maximum value of the current at the time of the normal operation of the control object circuit 22a at t3, the current I6 flowing into the current sink circuit 26 reaches zero, and at the same time, the current I7 starts to flow into the control object circuit 22a at once.

In this manner, according to the embodiment, the power supply activation control unit 27 performs the control such that a current equivalent to an amount of the current, which is increased in the pluggable module 2a due to the fact that the control object circuit 22a is started before the control object circuit 22a starts the operation, flows into the current sink circuit 26. Next, the power supply activation control unit 27 blocks the current supplied to the current sink circuit 26 at the same time of staring the operation of the control object circuit 22a by applying the voltage V4. Accordingly, even in a case where the control object circuit 22a starts the operation, it is possible to limit the occurrence of the inrush current without a rapid increase in the current I8a flowing into the entire pluggable module 2a.

Figure 3:
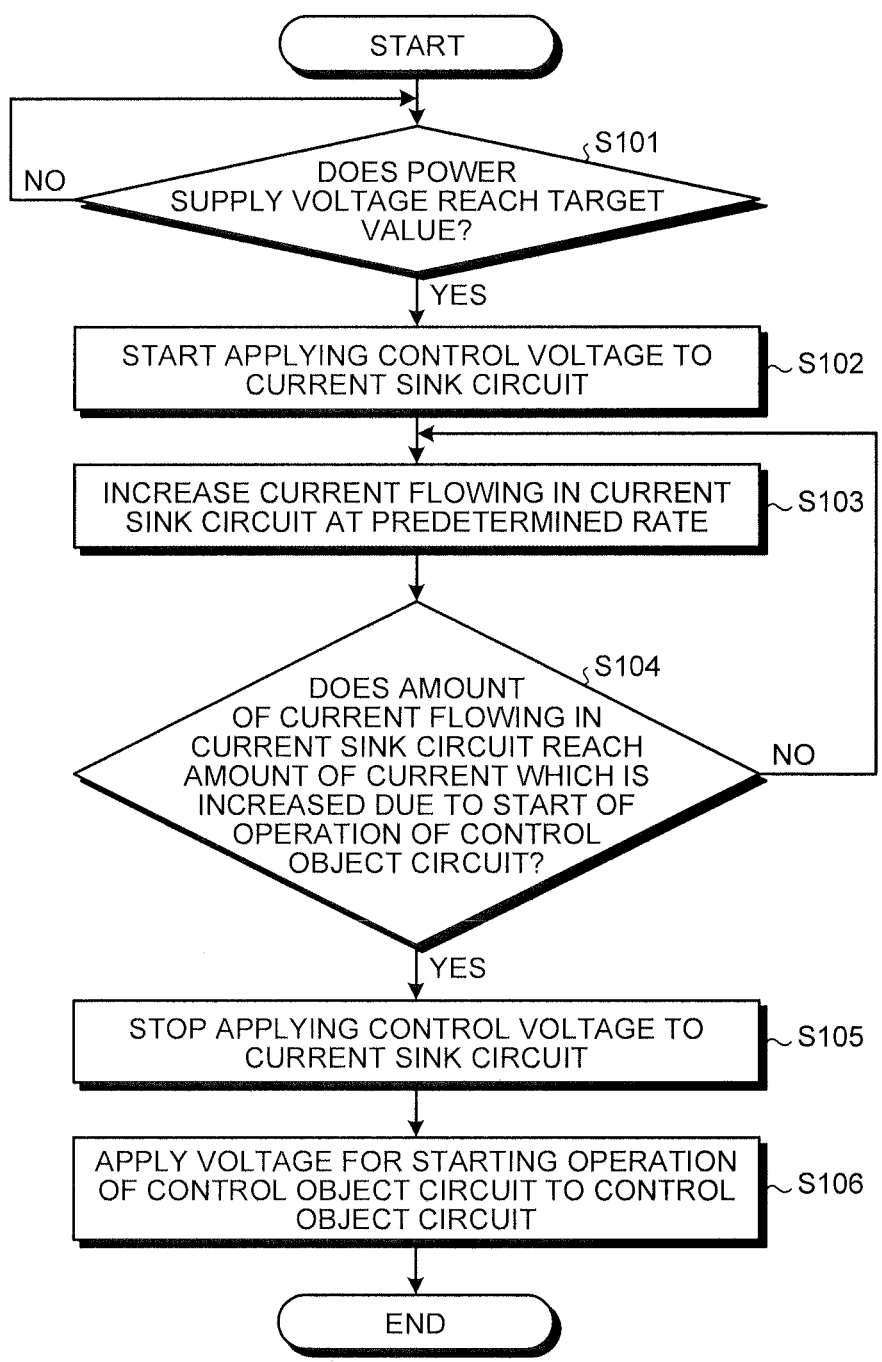
FIG. 3 is a flowchart illustrating an example of the procedure of processes of a power supply activation control unit according to the first embodiment.

Next, described is a specific operation of the power supply activation control unit 27 according to the embodiment. FIG. 3 is a flowchart illustrating an example of a procedure of processes of the power supply activation control unit 27 according to the first embodiment. In addition, the processes hereinafter denote only the processes relating to the control of the control object circuit 22a and the current sink circuit 26 after the pluggable module 2a is inserted into the apparatus main body 1 until the control object circuit 22a starts the operation among various operations which are performed by the power supply activation control unit 27.

The pluggable module 2a is inserted into the apparatus main body 1, and, as illustrated in FIG. 3, the power supply activation control unit 27 which is activated by the voltage supplied from the power supply 10 determines whether or not the power supply voltage V2 in the pluggable module 2a reaches a target value (Step S101). In this process, in a case where it is determined that the power supply voltage V2 reaches the target value (Yes in Step S101), the power supply activation control unit 27 starts applying the control voltage V3 to the current sink circuit 26 (Step S102). Accordingly, the current I6 starts to flow into the current sink circuit 26.

Subsequently, the power supply activation control unit 27 increases the current I6 flowing into the current sink circuit 26 at a predetermined rate by increasing the control voltage V3 applied to the current sink circuit 26 at a predetermined rate (Step S103). Next, the power supply activation control unit 27 determines whether or not an amount of the current I6 flowing into the current sink circuit 26 reaches the amount of the current which is increased in the pluggable module 2a due to the start of the operation of the control object circuit 22a (Step S104). In this process, in a case where the amount of the current I6 does not reach the amount of the current which is increased due to the start of the operation of the control object circuit 22a (No in Step S104), the process of the power supply activation control unit 27 proceeds to Step S103. On the other hand, in a case where it is determined that the amount of the current I6 reaches the amount of the current which is increased due to the start of the operation of the control object circuit 22a (Yes in Step S104), the process of the power supply activation control unit 27 proceeds to Step S105.

In Step S105, the power supply activation control unit 27 stops applying the control voltage V3 to the current sink circuit 26 (Step S105), and at the same time, applies the voltage V4 for starting the operation of the control object circuit 22a to the control object circuit 22a (Step S106). Accordingly, at the same time of blocking the current I6 flowing into the current sink circuit 26, the current I7, which is equivalent to an amount of the current flowing into the current sink circuit 26 until that time, starts to flow into the control object circuit 22a at once. When the process of Step S106 is ended, the power supply activation control unit 27 finishes the processes relating to the control of the control object circuit 22a and the current sink circuit 26 after the pluggable module 2a is inserted into the apparatus main body 1 until the control object circuit 22a starts the operation.

However, in the related art, because a temperature control circuit such as the control object circuit 22b starts the operation of the circuit after the power supply voltage rises up, there may be a problem in that it may not be possible to limit the occurrence of the inrush current by using only the hot swap controller 24. In the pluggable module 2a according to the embodiment, similarly to the control object circuit 22a, it is also possible to limit the occurrence of the inrush current at the time of starting the operation of the control object circuit 22b. Hereinafter, this case will be described.

Figure 4:
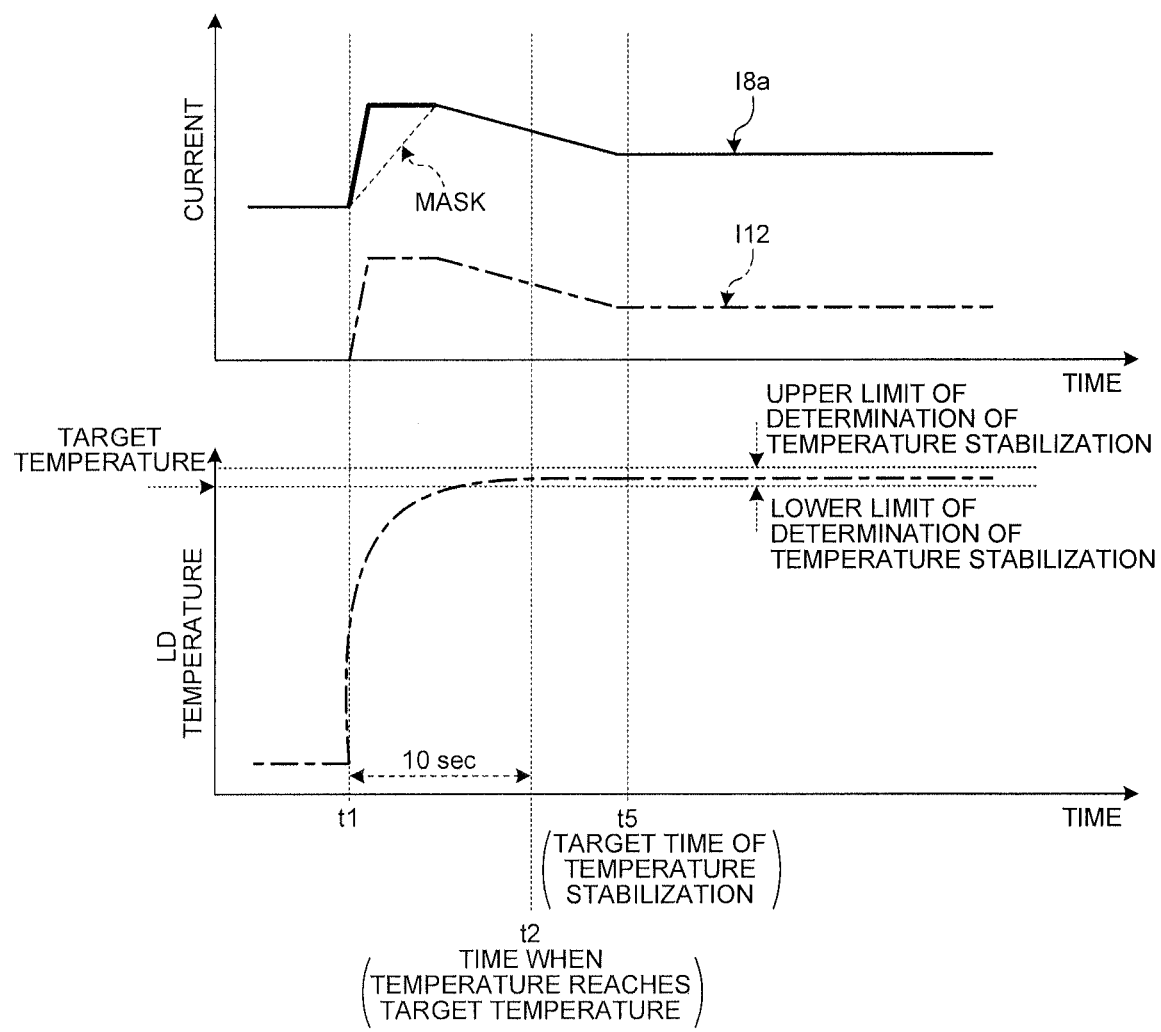
FIG. 4 is a graph illustrating a temporal change in a current flowing into a control object circuit and a temporal change in a temperature of an LD in a case where the LD is controlled so as to be stabilized within a predetermined temperature range in the target time in the related art.
Figure 5:
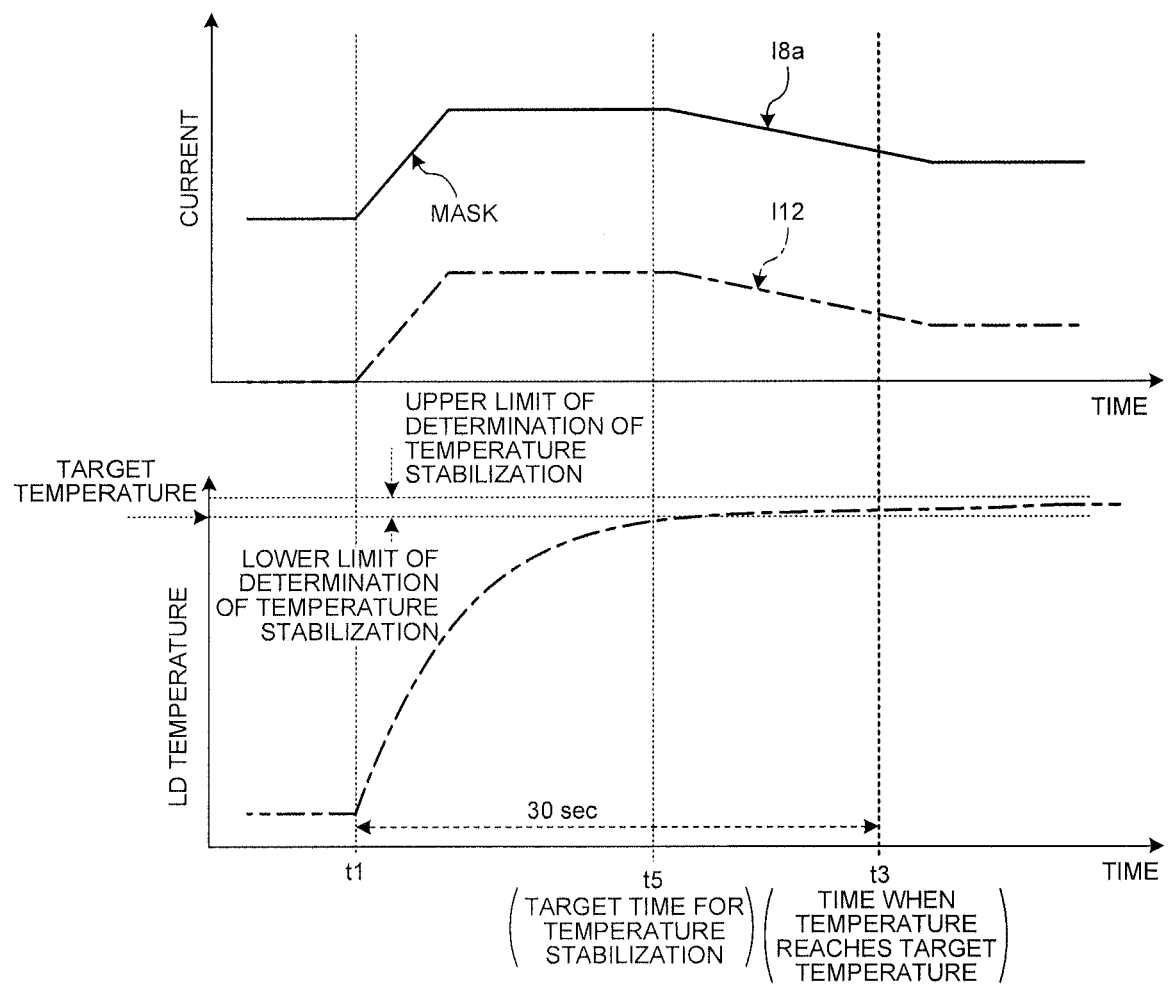
FIG. 5 is a graph illustrating a temporal change in a current flowing into the control object circuit and a temporal change in a temperature of the LD in a case where a change rate of a current at the time of starting temperature control is equal to or less than a mask in the related art.
Figure 13:
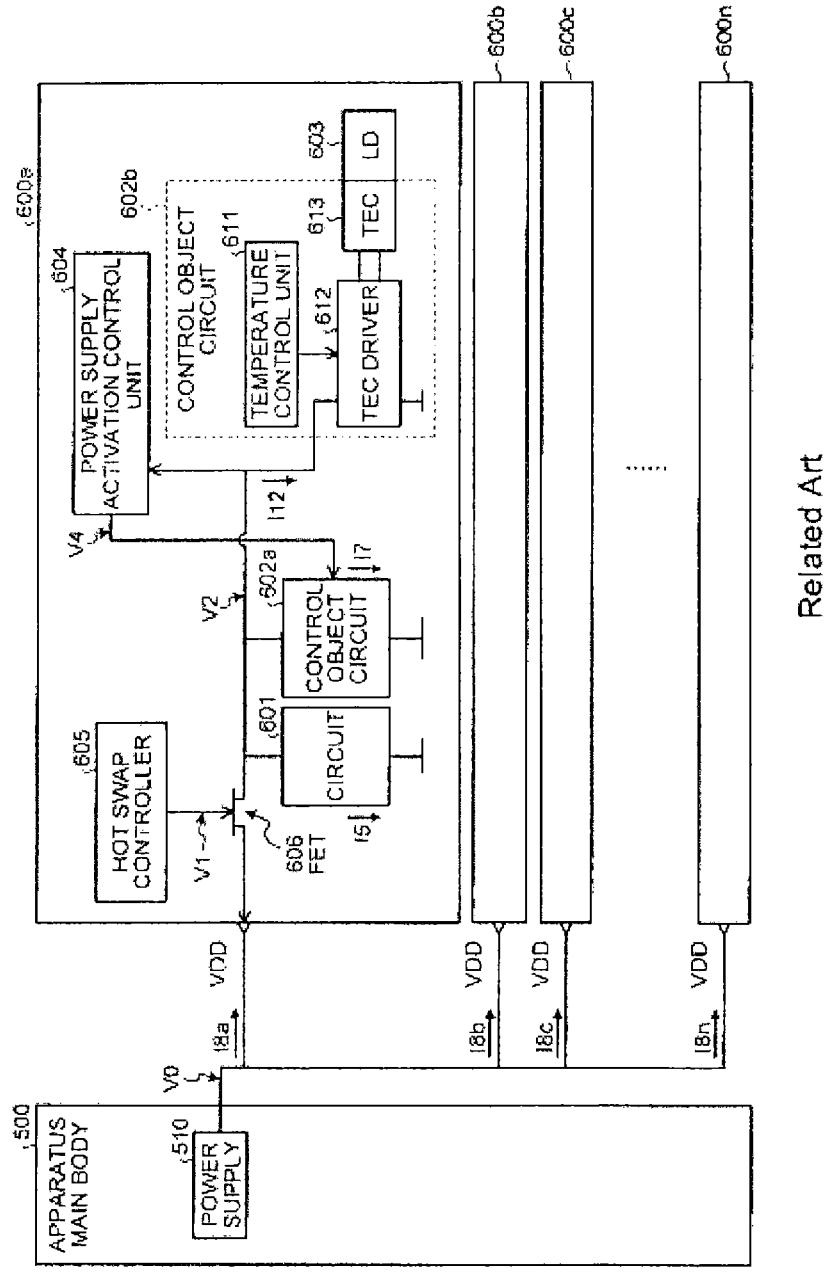
FIG. 13 is a diagram illustrating a state in which a plurality of pluggable modules is inserted into an apparatus main body in the related art.

First, for the comparison, described is a state in which the inrush current occurs at the time of starting the operation of the control object circuit 602b in the pluggable module 600a illustrated in FIG. 13. FIG. 4 is a graph illustrating a temporal change of a current flowing into the control object circuit 602b and a temporal change of a temperature of the LD 603 in a case where the LD 603 is controlled so as to be stabilized within a predetermined temperature range in a target time in the related art. In addition, FIG. 5 is a graph illustrating a temporal change of a current flowing into the control object circuit 602b and a temporal change of a temperature of the LD in a case where a change rate of the current at the time of starting temperature control is equal to or less than a mask in the related art.

The control object circuit 602a starts the operation, and the control object circuit 602b is supplied with the current I12 as illustrated in FIG. 4 when the temperature control is started at t1. Under the control of the temperature control unit 611, the current I12 is supplied to the TEC 613 through the TEC driver 612 and is converted into heat by the TEC 613 to adjust the temperature of the LD 603 to a target temperature. Herein, the time for which the temperature of the LD 603 is stabilized in a predetermined temperature range is previously set as the target time t5. The temperature control unit 611 performs the control such that the temperature of the LD 603 is stabilized in a predetermined temperature range up to the target time t5. As a result, the temperature of the LD 603 reaches the target temperature at the time t2 before the target time t5 and is stabilized in a predetermined temperature range at t5 as intended. In this case, the time t2–t1 from the time at which the current starts to flow into the control object circuit 602b to the time at which the LD 603 reaches the target temperature is, for example, about 10 seconds.

However, when the control is performed such that the target time t5 for the stabilization of the temperature of the LD 603 is satisfied as described above, a large amount of current instantaneously flows into the control object circuit 602b and thus the current I8a flowing into the pluggable module 600a is also instantaneously increased. As a result, in some cases, a current may flow into the pluggable module 600a at a change rate more than the maximum value 50 mA/mSec (hereinafter, "mask") of the change rate set by the standard. In other words, in some cases, an inrush current may occur.

Herein, in order to limit the occurrence of the inrush current, it is considered that the change rate of the current is allowed to be equal to or less than the mask by limiting the amount of the current supplied to the control object circuit 602b. However, in a case where the amount of the current supplied to the control object circuit 602b is limited, the control object circuit 602b may not satisfy the target time t5 for the stabilization of the temperature of the LD 603 due to an insufficient current. Therefore, as illustrated in FIG. 5, although the change rate of the current at the time of starting the control of the temperature may not be equal to or less than the mask, the LD 603 reaches the target temperature at t3 after the target time t5. In addition, the time t3–t1 after the current starts to flow into the control object circuit 602b until the LD 603 reaches the target temperature is, for example, about 30 sec.

Figure 6:
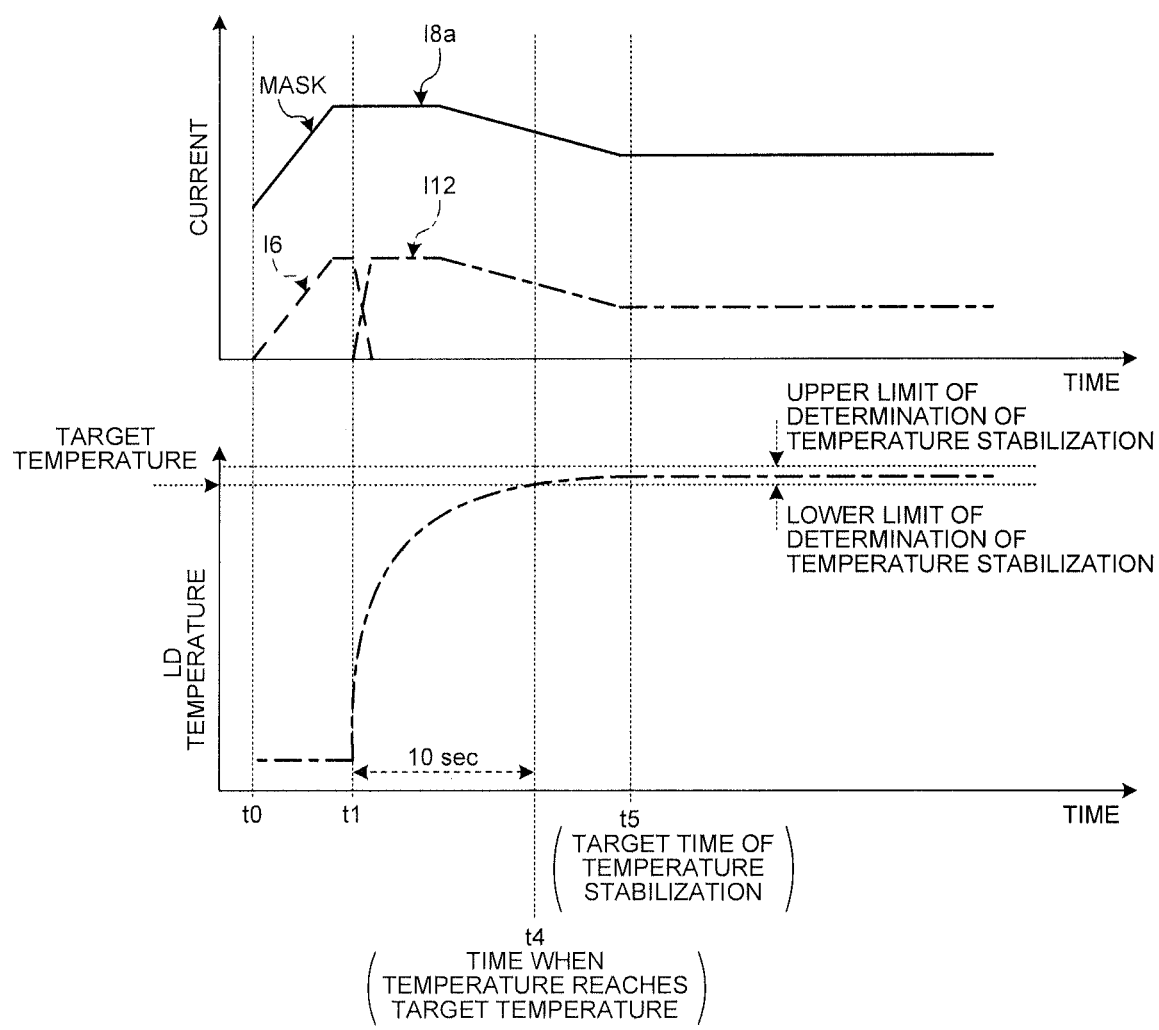
FIG. 6 is a graph illustrating a temporal change in a current supplied to a control object circuit and a temporal change in a temperature of an LD.

Subsequently, described is a state in which the inrush current is limited at the time of starting the operation of the control object circuit 22b installed in the pluggable module 2a according to the embodiment. FIG. 6 is a graph illustrating a temporal change of a current supplied to the control object circuit 22b and a temporal change of a temperature of the LD 23.

As illustrated in FIG. 6, if a predetermined time elapses from the start of the operation of the control object circuit 22a at t0, the current I6 is supplied to the current sink circuit 26. Next, the current I6 supplied to the current sink circuit 26 is increased at a predetermined rate, and if the current I6 reaches the amount of the current which is equivalent to the maximum value of the amount of the current which is increased in the pluggable module 2a in a case where the control object circuit 22b starts the operation, the amount of the current is maintained.

Subsequently, at t1, if it is the timing when the control of the temperature of the LD 23 is started by the control object circuit 22b, the amount of the current I6 flowing into the current sink circuit 26 is decreased, and the supplying of the current I12 to the control object circuit 22b is started. More specifically, the current I12 flowing into the control object circuit 22b is increased at a predetermined increase rate which is controlled by the temperature control unit 221 such that the temperature of the LD 23 is stabilized in a predetermined temperature range by the target time t5, and the current I6 flowing into the current sink circuit 26 is decreased at a rate which is equivalent to the increase rate of the current I12 flowing into the control object circuit 22b. As a result, because the rapid change in the current I8a in the pluggable module 2a is suppressed even when the control object circuit 22b starts the operation, the occurrence of the inrush current is limited.

In addition, the current I12 flowing into the control object circuit 22b is increased at the predetermined increase rate at which the temperature of the LD 23 is controlled by the temperature control unit 221 to be stabilized in a predetermined temperature range up to the target time t5. Therefore, the temperature of the LD 23 reaches the target temperature at the time t4 before the target time t5 and is stabilized in a predetermined temperature range at t5 as intended.

In this manner, the pluggable module 2a according to the embodiment can limit the occurrence of the inrush current at the time of starting the operation of the control object circuit 22b. Furthermore, the pluggable module 2a can solve trade-off between the limit of the occurrence of the inrush current and the stabilization of the temperature of the LD 23 in a predetermined temperature range in a target time.

Figure 7:
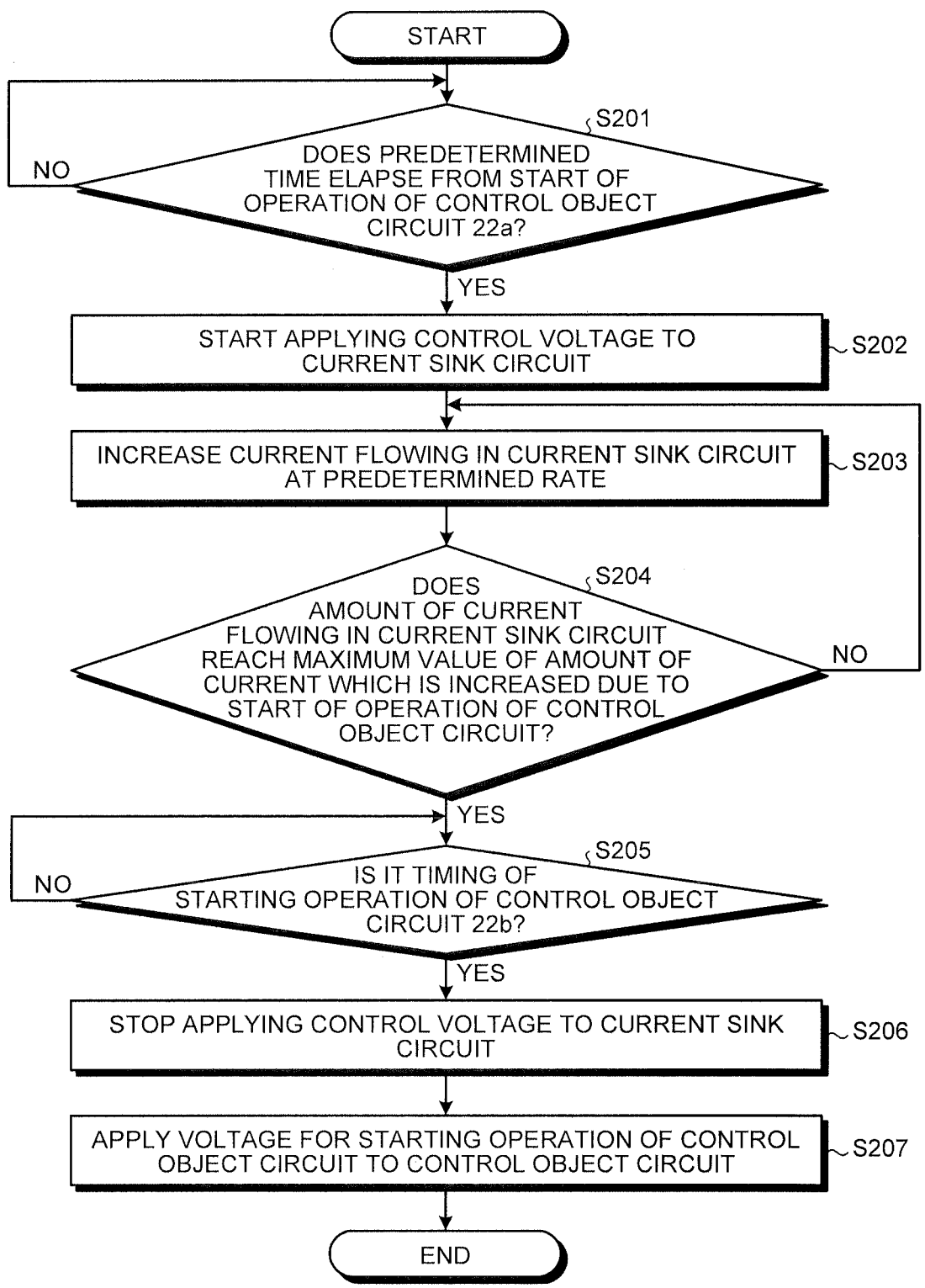
FIG. 7 is a flowchart illustrating an example of the procedure of processes of the power supply activation control unit according to the first embodiment.

Next, described is a specific operation of the power supply activation control unit 27 in this case. FIG. 7 is a flowchart illustrating an example of a procedure of processes of the power supply activation control unit 27 according to the first embodiment. In addition, the processes hereinafter denote only the processes relating to the control of the currents supplied to the control object circuit 22b and the current sink circuit 26 after the control object circuit 22a starts the operation until the control object circuit 22b starts the operation among various operations which are performed by the power supply activation control unit 27.

As illustrated in FIG. 7, the power supply activation control unit 27 first determines whether or not a predetermined time elapses from the start of the operation of the control object circuit 22a (Step S201). In this process, it is determined that a predetermined time elapses from the start of the operation of the control object circuit 22a (Yes in Step S201), the power supply activation control unit 27 applies the control voltage V3 to the current sink circuit 26 (Step S202). Accordingly, the current I6 starts to flow into the current sink circuit 26.

Subsequently, the power supply activation control unit 27 increases the current I6 flowing into the current sink circuit 26 at a predetermined rate by increasing the voltage V3 applied to the current sink circuit 26 at a predetermined rate (Step S203). Next, the power supply activation control unit 27 determines whether or not an amount of the current I6 flowing into the current sink circuit 26 reaches the maximum value of the amount of the current which is increased due to the start of the operation of the control object circuit 22b (Step S204). In this process, in a case where the amount of the current I6 does not reach the maximum value of the amount of the current which is increased due to the start of the operation of the control object circuit 22*b* (No in Step S204), the process of the power supply activation control unit 27 proceeds to Step S203. On the other hand, in a case where it is determined that the amount of the current I6 reaches the maximum value of the amount of the current which is increased due to the start of the operation of the control object circuit 22*b* (Yes in Step S204), the process of the power supply activation control unit 27 proceeds to Step S205.

In Step S205, it is determined whether or not to be at the timing of starting the operation of the control object circuit 22*b*. In addition, the power supply activation control unit 27 specifies the timing of starting the operation of the control object circuit 22*b* based on the command from the control object circuit 22*a*. In this process, in a case where it is the timing of starting the operation of the control object circuit 22*b* (Yes in Step S205), the power supply activation control unit 27 stops applying the control voltage V3 to the current sink circuit 26 (Step S206). In addition, at the same time of stopping applying the control voltage V3, the power supply activation control unit 27 applies the voltage V5 for starting the operation of the control object circuit 22*b* to the control object circuit 22*b* (Step S207).

More specifically, the power supply activation control unit 27 increases the current I12 flowing into the control object circuit 22*b* at the rate at which the temperature of the LD 23 is controlled by the temperature control unit 221 to be stabilized in a predetermined temperature range up to the target time t5. In addition, the power supply activation control unit 27 decreases the current I6 flowing into the current sink circuit 26 at the rate which is equivalent to the rate of the increase in the current I12 flowing into the control object circuit 22*b*. When the process of Step S207 is ended, the power supply activation control unit 27 finishes the processes relating to the control of the control object circuit 22*b* and the current sink circuit 26 after the control object circuit 22*a* starts the operation until the control object circuit 22*b* starts the operation.

Figure 8:
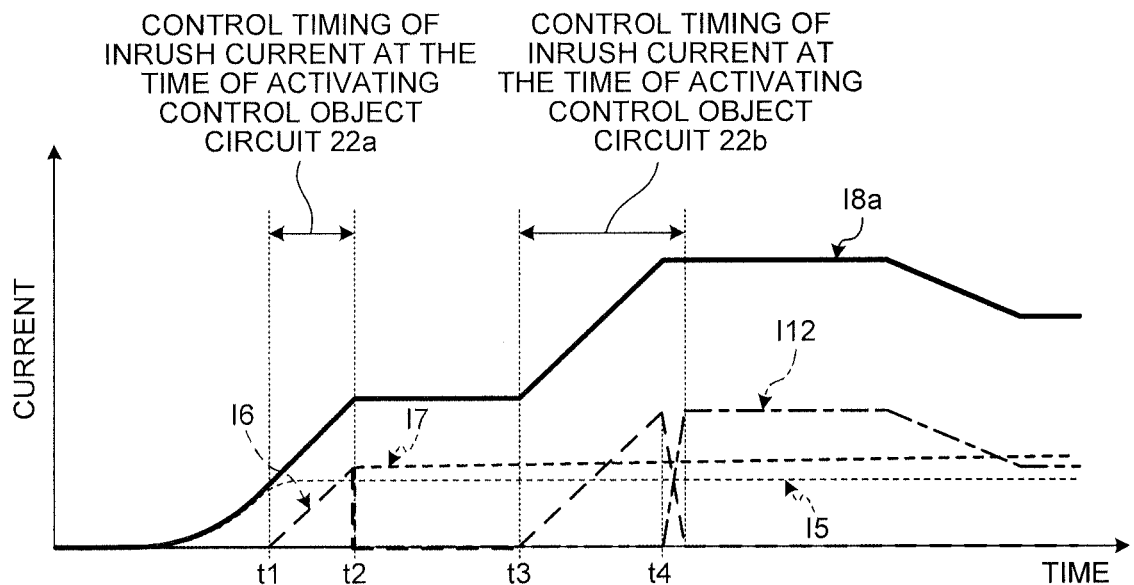
FIG. 8 is a diagram explaining control timings of inrush currents at the time of starting operations of control object circuits.

FIG. 8 is a diagram explaining control timings of the inrush currents at the time of starting the operations of the control object circuits 22*a* and 22*b*.

As illustrated in FIG. 8, in order to limit the occurrence of the inrush current at the time of starting the operation of the control object circuit 22*a*, the power supply activation control unit 27 first applies the control voltage V3 at a predetermined increase rate to the current sink circuit 26 at t1 before the start of the operation of the control object circuit 22*a*. Accordingly, the current I6 starts to flow into the current sink circuit 26 at a predetermined increase rate.

Next, it is assumed that the power supply voltage V2 in the pluggable module 2*a* reaches the target value, and at t2, the amount of the current I6 flowing into the current sink circuit 26 reaches the amount of the current which is increased in the pluggable module 2*a* due to the start of the operation of the control object circuit 22*a*. In this case, the power supply activation control unit 27 stops applying the control voltage V3 to the current sink circuit 26 and simultaneously applies the voltage V4 to the control object circuit 22*a*. Accordingly, the current I6 flowing into the current sink circuit 26 is blocked, and at the same time, the current I7 starts to flow into the control object circuit 22*a*.

Subsequently, in order to limit the occurrence of the inrush current at the time of starting the operation of the control object circuit 22*b*, the power supply activation control unit 27 applies the control voltage V3 to the current sink circuit 26 at a predetermined increase rate at t3 after a predetermined time elapses from the start of the operation of the control object circuit 22*a*. Accordingly, the current I7 starts to flow into the current sink circuit 26.

Next, it is assumed that, at t4, the amount of the current I6 flowing into the current sink circuit 26 reaches the maximum value of the amount of the current to be increased in the pluggable module 2*a* by starting the operation of the control object circuit 22*b*. In this case, the power supply activation control unit 27 stops applying the control voltage V3 to the current sink circuit 26 and simultaneously starts applying the voltage V5 to the control object circuit 22*b*. Accordingly, the current I6 flowing into the current sink circuit 26 is blocked, and at the same time, the current I12 starts to flow into the control object circuit 22*b*. More specifically, the power supply activation control unit 27 increases the current I12 flowing into the control object circuit 22*b* at the rate which is controlled by the temperature control unit 221 such that the temperature of the LD 23 is stabilized in a predetermined temperature range by the target time t5. In addition, the power supply activation control unit 27 decreases the current I6 flowing into the current sink circuit 26 at the rate which is equivalent to the rate of the increases in the current I12 flowing into the control object circuit 22*b*.

As described above, according to the embodiment, a current equivalent to an amount of the current to be increased by starting the operations of the control object circuits 22*a* and 22*b* before starting the operations of the control object circuits 22*a* and 22*b* flows into the current sink circuit 26 in advance. Next, according to the embodiment, the supply of the current to the current sink circuit 26 is blocked at the timing at which the operations of the control object circuits 22*a* and 22*b* are started. Accordingly, even in a case where the control object circuits 22*a* and 22*b*, of which the operations are to be started after the power supply voltage reaches a target value, starts the operations, it is possible to suppress the increase in the current I8*a* flowing into the entire of the pluggable module. Therefore, according to the embodiment, it is possible to more securely limit the occurrence of the inrush current.

In addition, according to the embodiment, in a case where the current I6 flowing into the current sink circuit 26 is increased at a predetermined rate so as to be equivalent to the amount of the current to be increased by starting the operations of the control object circuits 22*a* and 22*b*, the operations of the control object circuits 22*a* and 22*b* are started and simultaneously the supply of the current I6 to the current sink circuit 26 is blocked. In other words, according to the embodiment, the current corresponding to the amount of the current to be increased by starting the operations of the control object circuits 22*a* and 22*b* is not supplied to the current sink circuit 26 at once, but is gradually increased at a ratio based on the change rate of the current set according to a standard. Therefore, it is possible to limit the occurrence of the inrush current at the time of the supplying of the current to the current sink circuit 26. In addition, because the power supply activation control unit 27 controls to block the supply of the current to the current sink circuit 26 and to start the supply of the current to the control object circuits 22*a* and 22*b*, it is possible to suppress a deviation in the operation timing to a minimum. As a result, it is possible to more securely limit the occurrence of the inrush current at the time of starting the operations of the control object circuits 22*a* and 22*b*.

[b] Second Embodiment

In the first embodiment, described is the case where the power supply activation control unit 27 may recognize the timings of starting the operations of the control object circuits 22a and 22b when the pluggable module 2a is inserted into the apparatus main body 1.

Figure 9:
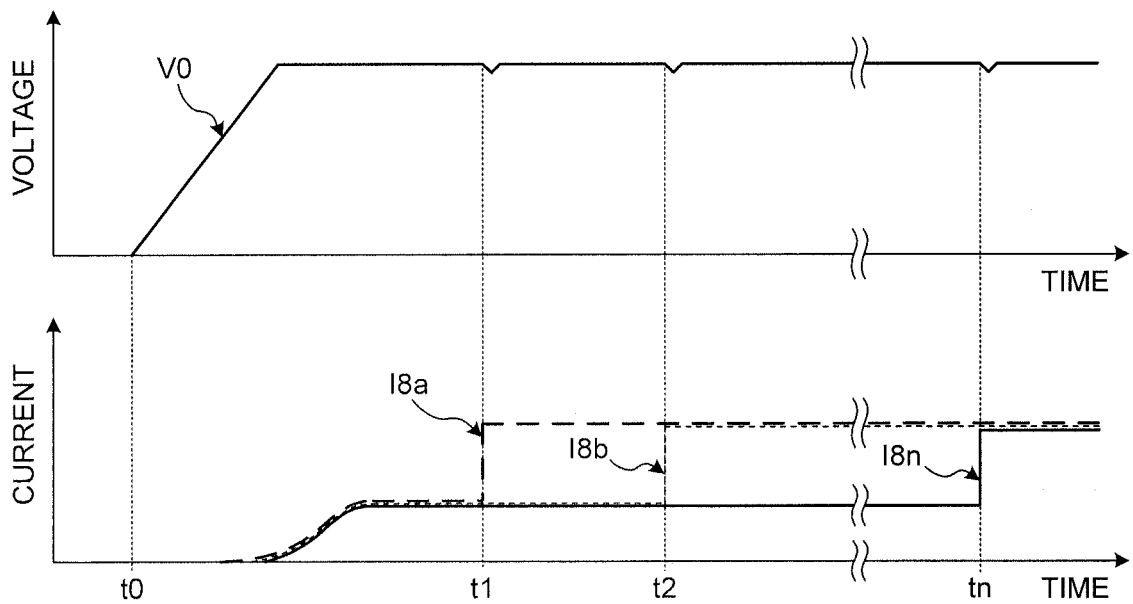
FIG. 9 is a graph illustrating a temporal change in a power supply voltage of an apparatus main body and temporal changes in currents flowing into pluggable modules of the related art.

However, for example, like the case where the apparatus main body 1 is activated in the state in which the pluggable module 2a is inserted into the apparatus main body 1, in some cases, the power supply activation control unit 27 may not recognize the timings of starting the operations of the control object circuits 22a and 22b. Hereinafter, this case will be described by using an example of the related art illustrated in FIG. 13. FIG. 9 is a graph illustrating a temporal change of a power supply voltage of the apparatus main body 500 and temporal changes of currents flowing into the pluggable modules 600a to 600n of the related art.

Even when the apparatus main body 500 is activated in the state in which the pluggable modules 600a to 600n are inserted into the apparatus main body 500, the inrush currents occur in the pluggable modules 600a to 600n. In this case, the apparatus main body 500 controls the timings of the operations of the control object circuits included in each of the pluggable modules 600a to 600n.

More specifically, as illustrated in FIG. 9, if the apparatus main body 500 is activated at t1, the current is gradually supplied to each of the pluggable modules 600a to 600n which are inserted into the apparatus main body 500 by controlling the FET 606 by the hot swap controller 605.

Herein, in a case where the control object circuits included in the pluggable modules 600a to 600n simultaneously start the operations, a heavy load is exerted on the power supply 510 of the apparatus main body 500. Therefore, the apparatus main body 500 performs the control such that the timings of starting the operations of the control object circuits included in the pluggable modules 600a to 600n does not overlap with each other among the pluggable modules.

More specifically, the apparatus main body 500 first activates the control object circuit 602a included in the pluggable module 600a at t1. Accordingly, at t1, only the amount of the current I8a flowing into the pluggable module 600a is increased. Next, after a predetermined time elapses from t1, the apparatus main body 500 activates the pluggable module 600b at t2. Accordingly, at t2, only the amount of the current I8b flowing into the pluggable module 600b is increased. In this manner, because the apparatus main body 500 shifts the activation timing of each of the pluggable modules 600a to 600n, the load on the power supply 510 can be prevented from being rapidly increased.

In this manner, in a case where the apparatus main body 500 is activated in the state in which a plurality of the pluggable modules 600a to 600n are inserted into the apparatus main body 500, the timing of the operation of the control object circuit included in each of the pluggable modules 600a to 600n is determined by the apparatus main body 500. Therefore, in a case where the occurrence of the inrush current is limited by the current sink circuit 26, the power supply activation control unit 27 does not recognize the timings of starting the operations of the control object circuits 22a and 22b, and it is difficult to performing the blocking of the current to the current sink circuit 26 at an appropriate timing.

In addition, even in the case of performing the control of shifting the timing of starting the operation of the control object circuit included in each of the pluggable modules 600a to 600n as described above, the occurrence of the inrush current may not be limited. In addition, because the pluggable modules 600a to 600n are sequentially activated in the control method described above, there is a problem in that the activation time is increased.

Therefore, according to the second embodiment, even in a case where the timings of starting the operations of the control object circuits 22a and 22b are determined by the apparatus main body 1, it is possible to performing the blocking of the current supplied to the current sink circuit 26 at an appropriate timing. Hereinafter, described is the pluggable module according to the embodiment. In addition, the same components as those of the configuration described above are denoted by the same reference numerals, and the description thereof is not repeated.

Figure 10:
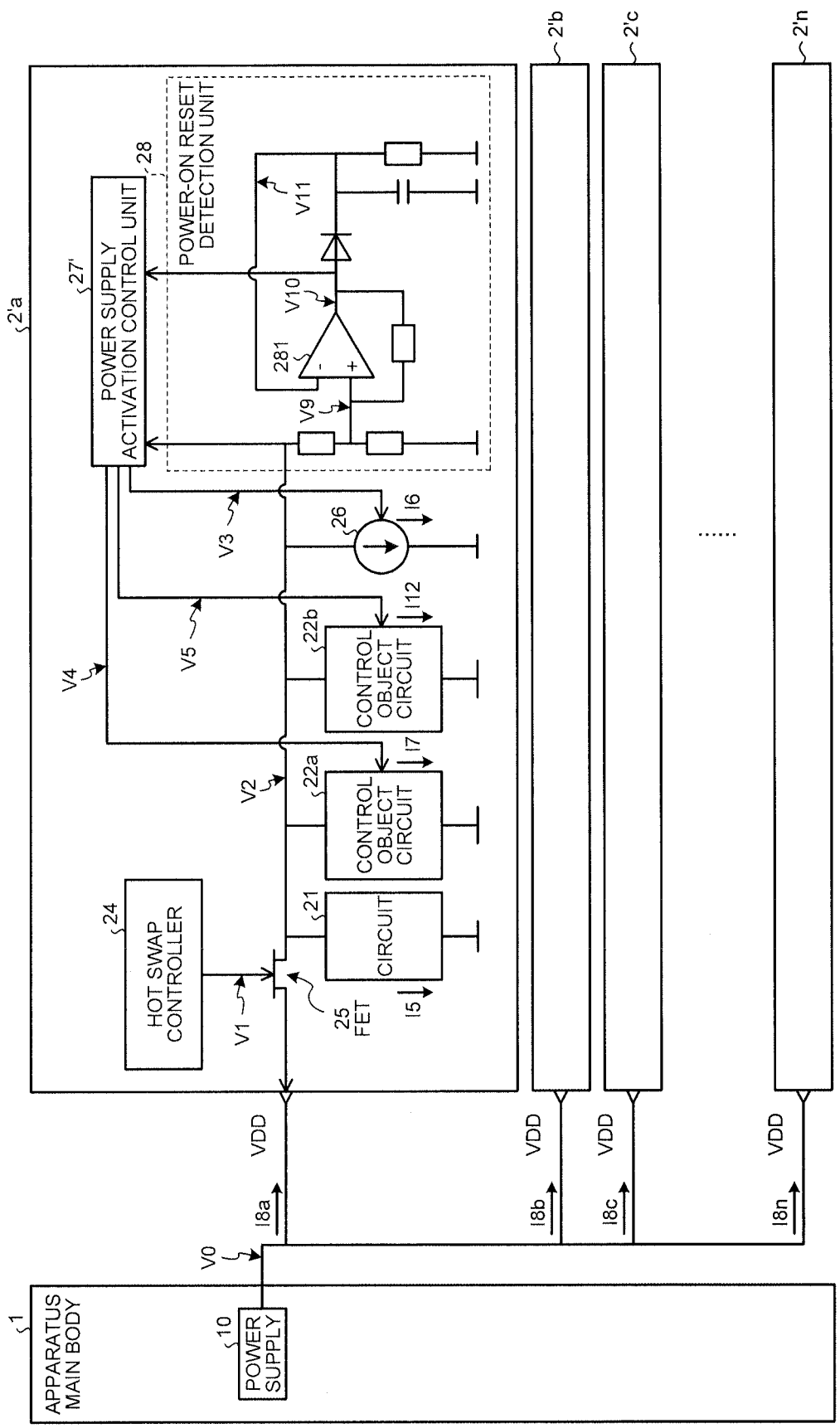
FIG. 10 is a schematic diagram illustrating the configuration of a pluggable module according to a second embodiment.

First, described is a configuration of the pluggable module according to the embodiment. FIG. 10 is a schematic diagram illustrating a configuration of the pluggable module according to the second embodiment. As illustrated in FIG. 10, a plurality of pluggable modules 2'a to 2'n are inserted into the apparatus main body 1. In addition, the pluggable module 2'a according to the embodiment further includes a power-on reset detection unit 28 besides the configuration of the first embodiment described above. The power-on reset detection unit may be expressed in a power-on reset detector. In this case, the detector includes a configuration such as a detection circuit.

The power-on reset detection unit 28 detects that the operations of the control object circuits 22a and 22b are started. More specifically, the power-on reset detection unit 28 detects the start of the operations of the control object circuits 22a and 22b by detecting a voltage drop in the circuit module occurring due to the start of the operations of the control object circuits 22a and 22b.

As illustrated in FIG. 10, the power-on reset detection unit 28 is a peak hold circuit including an operational amplifier (op-amp) 281. The op-amp 281 includes two input ports of positive and negative input ports and one output port. The op-amp 281 amplifies a potential difference between the positive input port and the negative input port caused by the voltage drop of the pluggable module 2'a, which occurs at the time of starting the operations of the control object circuits 22a and 22b, and outputs the potential difference to the power supply activation control unit 27'. In addition, the positive input port of the op-amp 281 is connected to the power supply line of the pluggable module 22'a and directly receives a change in the power supply voltage V2 of the pluggable module 22'a. In addition, the output port is connected to the power supply activation control unit 27' and the voltage output from the output port is input to the power supply activation control unit 27'.

When it is detected that the operations of the control object circuits 22a and 22b are started through the power-on reset detection unit 28, the power supply activation control unit 27' blocks the supply of the current I6 by stopping the application of the control voltage V3 to the current sink circuit 26. More specifically, in a case where the voltage input from the power-on reset detection unit 28 is rapidly decreased, the power supply activation control unit 27' detects that the operations of the control object circuits 22a and 22b are started through the power-on reset detection unit 28 and blocks the current to be supplied to the current sink circuit 26.

Figure 11:
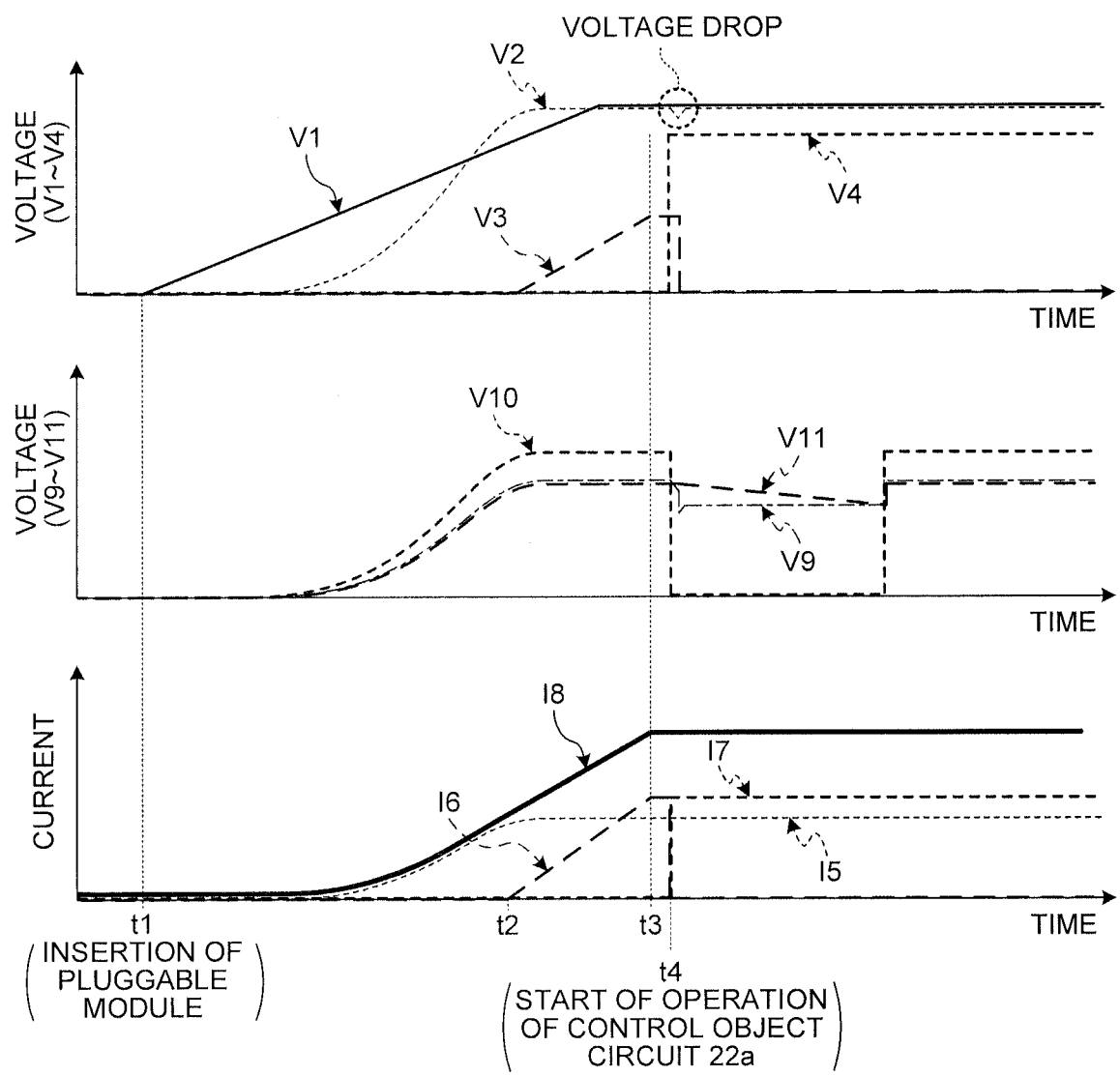
FIG. 11 is a graph illustrating temporal changes in a voltage and a current in the pluggable module according to the second embodiment.

Hereinafter, described is a state in which the occurrence of the inrush current in the pluggable module 2'a is limited by the power supply activation control unit 27' according to the embodiment. FIG. 11 is a graph illustrating a temporal change of a voltage and a current in the pluggable module 2'a according to the second embodiment. In addition, as illustrated in FIG. 10, the voltage of the positive input port of the op-amp 281 is denoted by V9; the voltage of the output port of the op-amp 281 is denoted by V10; and the voltage of the negative input port of the op-amp 281 is denoted by V11.

As illustrated in FIG. 11, in a case where the pluggable module 2'a is inserted into the apparatus main body 1 at t1, similarly to the first embodiment, the current I8a flowing into the pluggable module 2a is gently increased by controlling the FET 25 by the hot swap controller 24. Next, in a case where the power supply voltage V2 in the pluggable module 2'a reaches the target value at t2, the power supply activation control unit 27' applies the control voltage V3 to the current sink circuit 26 to flow the current into the current sink circuit 26.

Subsequently, the power supply activation control unit 27' increases the current I6 flowing into the current sink circuit 26 at a predetermined rate by increasing the control voltage V3 applied to the current sink circuit 26. Next, at t3, an amount of the current I6 flowing into the current sink circuit 26 becomes an amount of the current equivalent town amount of the current which is increased in the pluggable module 2'a in a case where the operation of the control object circuit 22a is started. In this case, the power supply activation control unit 27' allows the current I6 corresponding to the amount of the current to continuously flow into the current sink circuit 26.

According to the embodiment, even in a case where the voltage V4 is applied from the power supply activation control unit 27', the control object circuit 22a is in the reset state until a command for starting the operation is issued from the apparatus main body 1. Therefore, as illustrated in FIG. 11, the voltage V4 is maintained to be in the LOW state for a while after the time of t3 elapses.

On the other hand, if the control object circuit 22a starts the operation based on a command from the apparatus main body 1 at t4, the control object circuit 22a changes the voltage V4 from the LOW state to the HIGH state. Accordingly, the current I7 starts to flow into the control object circuit 22a at once. In addition, if the current I7 flows into the control object circuit 22a, a small voltage drop occurs in the power supply voltage V2 of the pluggable module 2'a. The power supply activation control unit 27' determines that the operation of the control object circuit 22a starts based on the detection of the small voltage drop using the power-on reset detection unit 28.

More specifically, as illustrated in FIG. 11, if the power supply voltage V2 of the pluggable module 2'a starts to be increased at t1, the voltage V9 of the positive input port of the op-amp 281 is directly influenced by the change in the power supply voltage V2 and thus the voltage V9 is increased similarly to the power supply voltage V2. In addition, because the op-amp 281 performs the feedback control of the voltage V10 of the output port in such a manner that the voltage V11 of the negative input port becomes equal to the voltage V9 of the positive input port, the voltage V11 of the negative input port is also increased similarly to the voltage V9 and the power supply voltage V2.

Herein, in a case where the voltage drop occurs in the power supply voltage V2 due to the start of the operation of the control object circuit 22a, the voltage V9 of the positive input port is decreased due to the influence of the voltage drop. In a case where the voltage V9 of the positive input port is decreased, the op-amp 281 allows the voltage V11 of the negative input port to be equal to the voltage V9 through the feedback control. However, because the power-on reset detection unit 28 is a peak hold circuit, the voltage V11 of the negative input port is more gradually decreased than the voltage V9 of the positive input port. In this manner, even when the voltage V9 of the positive input port is decreased due to the voltage drop in the power supply voltage V2, because the voltage V11 of the negative input port is not decreased so as to be equal to V9, a potential difference occurs between the voltage V9 of the positive input port and the voltage V11 of the negative input port. Therefore, the op-amp 281 amplifies the potential difference occurring between the positive input port and the negative input port and outputs the amplified potential difference, and accordingly the voltage V10 of the output port is rapidly decreased.

In this manner, the voltage V9 of the positive input port functions as a voltage for monitoring the power supply voltage V2 of the pluggable module 2'a. In addition, the voltage V10 of the negative input port functions as a voltage for amplifying and detecting the voltage drop in the power supply voltage V2 of the pluggable module 2'a. In addition, the voltage V11 of the output port functions as a peak hold voltage for detecting a decrease in the power supply voltage V2 of the pluggable module 2'a.

Next, in a case where it is detected that the voltage V10 of the output port is rapidly decreased, the power supply activation control unit 27' determines that the control object circuit 22a starts the operation and stops applying the control voltage V3 to the current sink circuit 26. Accordingly, at t4, the current I6 flowing into the current sink circuit 26 becomes zero at the timing which is equivalent to the timing when the current I7 starts to flow into the control object circuit 22a at once. As a result, even in a case where the control object circuit 22a starts the operation, the occurrence of the inrush current may be limited without a rapid increase in the current I8a flowing into the pluggable module 2'a.

In this manner, the power supply activation control unit 27' according to the embodiment detects the start of the operation of the control object circuit 22a by using the power-on reset detection unit 28. Accordingly, even in a case where the timing of starting the operation of the control object circuit 22a is determined by a command from the apparatus main body 1, it is possible to block the current supplied to the current sink circuit 26 at the timing which is equivalent to the timing when the current I7 starts to flow into the control object circuit 22a.

Figure 12:
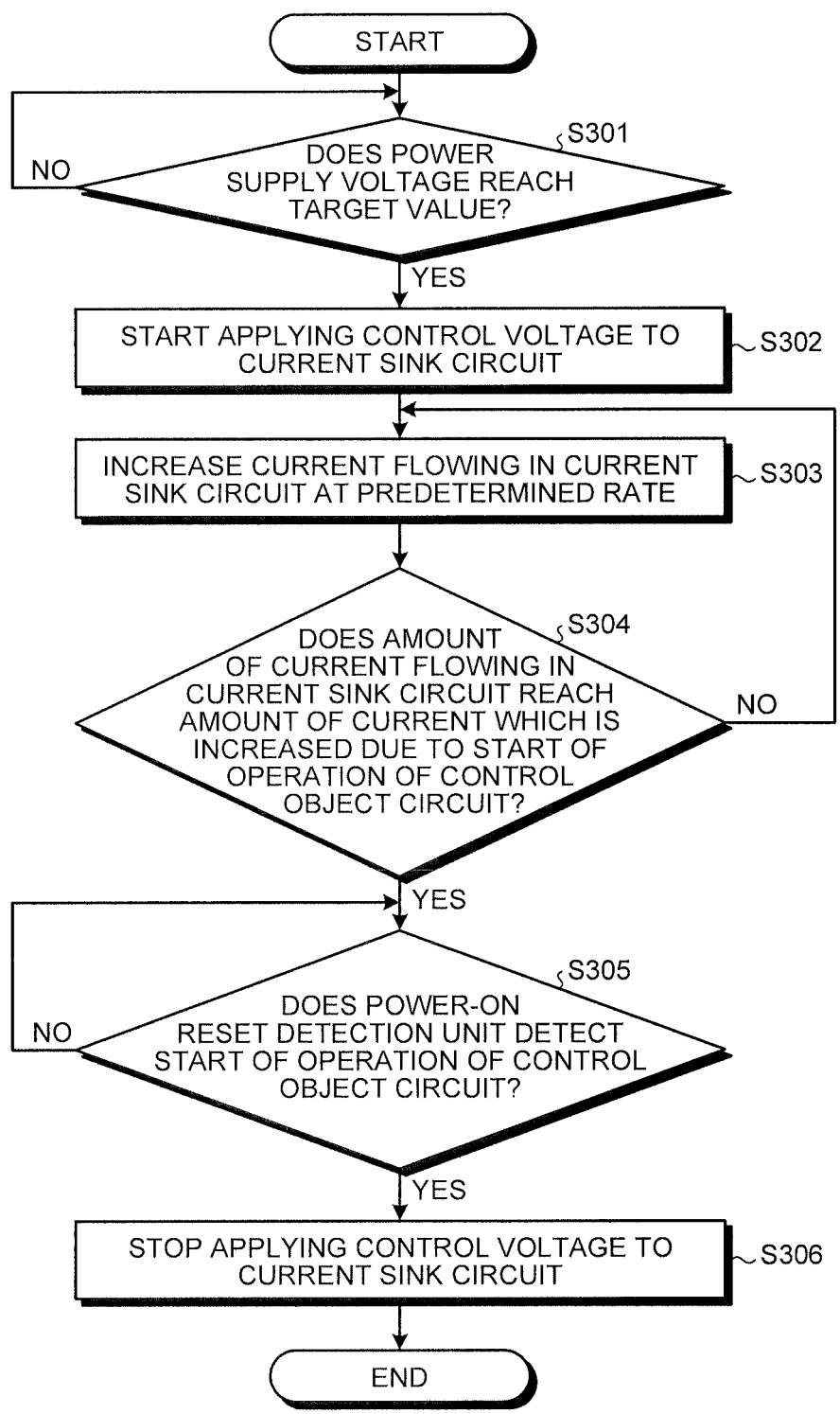
FIG. 12 is a flowchart illustrating an example of the procedure of processes of a power supply activation control unit according to the second embodiment.

Next, described is a specific operation of the power supply activation control unit 27' according to the embodiment. FIG. 12 is a flowchart illustrating an example of a procedure of processes of the power supply activation control unit 27' according to the second embodiment. In addition, the processes hereinafter denote only the processes relating to the control of the control object circuit 22a and the current sink circuit 26 after the pluggable module 2'a is inserted into the apparatus main body 1 until the control object circuit 22a starts the operation according to a command from the apparatus main body 1 among various operations which are performed by the power supply activation control unit 27'.

The pluggable module 2'a is inserted into the apparatus main body 1, and as illustrated in FIG. 12, the power supply activation control unit 27' which is activated by the voltage supplied from the power supply 10 determines whether or not the power supply voltage V2 in the pluggable module 2'a reaches a target value (Step S301). In this process, in a case where it is determined that the power supply voltage V2 reaches the target value (Yes in Step S301), the power supply activation control unit 27' applies the control voltage V3 to the current sink circuit 26 (Step S302). Accordingly, the current I6 starts to flow into the current sink circuit 26.

Subsequently, the power supply activation control unit 27' increases the current I6 flowing into the current sink circuit 26 at a predetermined rate by increasing the control voltage V3 applied to the current sink circuit 26 at a predetermined rate (Step S303). Next, the power supply activation control unit 27' determines whether or not an amount of the current I6 flowing into the current sink circuit 26 reaches the amount of the current which is increased due to the start of the operation of the control object circuit 22a (Step S304). In this process, in a case where the amount of the current I6 does not reach the amount of the current which is increased due to the start of the operation of the control object circuit 22a (No in Step S304), the process of the power supply activation control unit 27' proceeds to Step S303. On the other hand, in a case where it is determined that the amount of the current I6 reaches the amount of the current which is increased due to the start of the operation of the control object circuit 22a (Yes in Step S304), the process of the power supply activation control unit 27' proceeds to Step S305.

In Step S305, the power supply activation control unit 27' determines whether or not the power-on reset detection unit 28 detects the start of the operation of the control object circuit 22a. In this process, in a case where it is determined that the power-on reset detection unit 28 detects the start of the operation of the control object circuit 22a (Yes in Step S305), the power supply activation control unit 27' stops applying the control voltage V3 to the current sink circuit 26 (Step S306). Accordingly, the current supplied to the current sink circuit 26 is blocked. When the process of Step S306 is ended, the power supply activation control unit 27' finishes the processes relating to the control of the control object circuit 22a and the current sink circuit 26 after the pluggable module 2'a is inserted into the apparatus main body 1 until the control object circuit 22a starts the operation according to a command from the apparatus main body 1.

As described above, according to the second embodiment, the circuit module further includes a power-on reset detection unit 28 which detects the stat of the operations of the control object circuits 22a and 22b. Therefore, according to the second embodiment, in a case where the start of the operation of the control object circuit 22a is detected by the power-on reset detection unit 28, the current supplied to the current sink circuit 26 is blocked. Accordingly, even in a case where the timing when the power supply activation control unit 27' applies the voltage V4 to the control object circuits 22a and 22b is different from the timing where the current I7 starts to flow into the control object circuits 22a and 22b, it is possible to appropriately perform the blocking the current supplied to the current sink circuit 26. As a result, similarly to the first embodiment, even in a case where the control object circuits 22a and 22b, of which the operations are to be started after the power supply voltage becomes the target value, start the operations, it is possible to suppress an increase in the current I8a flowing into the entire of the pluggable module. Therefore, according to the second embodiment, it is possible to more securely limit the occurrence of the inrush current.

Hereinbefore, although the embodiments of the present invention are described with reference to the drawings, the embodiments are exemplary, and various modifications and changes may be made from the embodiments disclosed in "Summary" by the ordinarily skilled in the art.

For example, although each of the embodiments is described by using the optical communication router as the apparatus main body 1 and using the electro-optical conversion module as the pluggable module, the present invention is not limited thereto, but the pluggable module may be, for example, a USB memory which may be detachable with respect to a personal computer as the apparatus main body 1.

According to an aspect of embodiments of the circuit module disclosed, the effect of securely inhibiting the occurrence of the inrush current can be achieved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A circuit module comprising:
   a control object circuit that starts an operation when a power supply voltage reaches a target value;
   a current sink circuit that consumes a current supplied thereto; and
   a power supply activation controller that increases the current flowing into the current sink circuit at a predetermined rate in the state where the power supply voltage is constant at the target value before starting the operation of the control object circuit and that, when an amount of the current flowing into the current sink circuit is equivalent to an increased amount of current according to the start of the operation of the control object circuit, makes the control object circuit start the operation and blocks a supply of the current to the current sink circuit simultaneously with the start of the operation of the control object circuit.

2. The circuit module according to claim 1, wherein when the power supply voltage reaches a predetermined voltage, the power supply activation controller starts supplying the current to the current sink circuit.

3. A circuit module comprising:
   a control object circuit that takes a predetermined amount of current to start an operation;
   a current sink circuit that consumes a current supplied thereto;
   a power-on reset detector that detects that the operation of the control object circuit is started; and
   a power supply activation controller that performs a control in such a manner that a current, which is equivalent to an increased amount of current according to the start of the operation of the control object circuit, flows into the current sink circuit and that blocks a supply of the current to the current sink circuit when the power-on reset detector detects that the operation of the control object circuit is started.

4. The circuit module according to claim 3, wherein the power-on reset detector detects that the operation of the control object circuit is started by detecting a voltage drop of the circuit module caused by the start of the operation of the control object circuit.

* * * * *